United States Patent [19]
Diffenderfer et al.

[11] Patent Number: 5,543,657
[45] Date of Patent: Aug. 6, 1996

[54] SINGLE LAYER LEADFRAME DESIGN WITH GROUNDPLANE CAPABILITY

[75] Inventors: Steven J. Diffenderfer, Deposit; Hussain Shaukatullah, Endwell, both of N.Y.

[73] Assignee: International Business Machines Corporation, Armonk, N.Y.

[21] Appl. No.: 319,525

[22] Filed: Oct. 7, 1994

[51] Int. Cl.⁶ .................................................. H01L 23/495
[52] U.S. Cl. .......................... 257/666; 257/670; 257/676; 257/796
[58] Field of Search .................................... 257/666, 676, 257/677, 670, 784, 787, 796

[56] References Cited

U.S. PATENT DOCUMENTS

| | | | |
|---|---|---|---|
| 4,972,253 | 11/1990 | Palino et al. | 357/74 |
| 5,173,767 | 12/1992 | Lange et al. | 257/664 |
| 5,203,699 | 6/1991 | Hara et al. | 357/68 |
| 5,250,844 | 10/1993 | Smith | 257/695 |
| 5,309,019 | 5/1994 | Moline et al. | 257/666 |
| 5,397,918 | 3/1995 | Yokochi et al. | 257/666 |

OTHER PUBLICATIONS

IBM Technical Disclosure Bulletin vol. 29, No. 5, Oct. 1986, Multi–Chip Plastic Leaded Chip Carrier.
SGS–Thomson Microelectronics, Thermal Management In Surface Mounting. pp. 555–568, Jun. 1989.
Karnezos et al., EDQUAD–An Enhanced Performance Plastic Package, 1994 Proceedings 44th Electronic Components and Technology Conference, May 1, –May 4, 1994, IEEE 1994. pp. 63–66.
Mallik et al., MM Multi–Layer Molded High Performance PQFP, Multi–Layer Molded Plastic Package, pp. 2–1 to 2–9, Apr. 27, 1989.
Diagrams form a presentation by AMKOR Electronics Personnel in Fishkill May 18, 1994.

*Primary Examiner*—Mark V. Prenty
*Attorney, Agent, or Firm*—Pollock, Vande Sande & Priddy

[57] ABSTRACT

An electronic package including a leadframe that includes a single layer of an electrically conducting material, a semiconductor chip support, a common ground portion surrounding the semiconductor chip support and electrically connected thereto, a plurality of signal leads electrically isolated from each other and from the common ground portion, and a plurality of ground leads electrically connected to the common ground portion. A semiconductor chip including a plurality of signal sites and a plurality of ground sites is mounted on the semiconductor chip support of the leadframe. A plurality of electrical connections are provided between selected ones of the signal sites to respective ones of the signal leads and between selected ones of the ground sites to respective ones of the ground leads. A protective enclosure is provided substantially about the semiconductor device, the semiconductor chip support, the common ground portion of the leadframe, and at least a portion of the signal leads.

11 Claims, 7 Drawing Sheets

SINGLE LAYER LEADFRAME DESIGN WITH GROUNDPLANE CAPABILITY

FIELD OF THE INVENTION

The invention relates to leadframes upon which an integrated circuit may be mounted, to electronic packages including leadframes, and to methods for making leadframes and electronic packages.

BACKGROUND OF THE INVENTION

Electronic circuit packages including a plurality of integrated circuit chips are widely used in a variety of well-known applications from computers to computer controls of a wide variety of devices, for example, automobiles and home appliances, among others. Electronic circuit packages for complex systems typically are comprised of a multiplicity of interconnected integrated circuit chips. The integrated circuit chips are usually made from a semiconductor material such as silicon or gallium arsenide. Microscopic circuits are formed in the various layers of the integrated circuit chips using known photolithographic techniques. The integrated circuit chips may be mounted in packages which are then mounted on printed wiring boards. Packages including integrated circuit chips typically have numerous external pins which are mechanically attached by solder or a variety of other known techniques to conductor patterns on the printed wiring board.

Typically, the packages on which these integrated semiconductor chips are mounted include a substrate or other chip mounting device. One example of such a substrate is a leadframe. High performance leadframes typically are multi-layer structures including power, ground, and signal planes. Leadframes also typically include at least an area on which an semiconductor integrated chip is mounted and a plurality of power, ground, and/or signal leads to which power, ground, and/or signal sites of the integrated semiconductor chip are electronically attached. Semiconductor integrated chips may be attached to the leadframe using adhesive or any other techniques for attaching such chips to a leadframe which are commonly known to those skilled in the art, such as soldering. The power, ground and signal sites on the chip may then be electrically connected to selected power, ground and signal plane or individual leads of the leadframe.

Once the integrated circuit chip(s) are attached to the leadframe, the leadframe may be enclosed or encapsulated in a protective enclosure. Such enclosures may include encapsulation in a plastic or a multi-part housing made of plastic, ceramic, or metal. The enclosure may protect the leadframe and the attached chip from physical, electrical, and/or chemical damage. The leadframe and attached chip(s) may then be mounted on, for example, a circuit board or card along with other leadframes or devices. The circuit board or card may then be incorporated into a wide variety of devices such as computers, automobiles, appliances, among others.

Typical known leadframes which include a plurality of layers are complex and expensive to produce. The multiple planes were included in the design of known leadframes as a solution to accommodate the high density of leads in the highly integrated circuits typically used today. The multiple planes having a single function, such as ground, power, and signal, were incorporated in a design of frames as an attempt to electrically isolate the various planes to reduce electrical interference, such as noise, among the planes. The layers must be built up using known techniques. Therefore, the multi-layer leadframe, although functionally effective, is very complex and not cost effective.

SUMMARY OF THE INVENTION

The present invention was developed to solve problems with known leadframes.

Accordingly, it is an object of the present invention to provide a much less complex leadframe which may be produced at a lower cost than typical known leadframes.

Also, an object of the present invention is to provide a leadframe which may be more quickly produced and using less materials.

Another object of the present invention is to provide a single layer leadframe having ground plane capability.

A further object of the present invention is to provide a single layer leadframe having multiple functions, such as ground and signal functions in a single layer.

A still further object of the invention is to provide a ground ring that allows for attaching a chip with many more ground leads than known leadframes.

According to preferred aspects, the present invention is a method of making an electronic package. The method includes the step of providing a leadframe formed from a single layer of material. The leadframe includes a semiconductor chip support, a plurality of signal leads, and a common ground portion substantially surrounding the chip support section.

The method also includes the step of positioning a semiconductor chip having a plurality of signal sites and a plurality of ground sites on the semiconductor chip support of the leadframe. Further, the method includes the step of electrically connecting selected ones of the signal sites of the semiconductor to respective ones of the signal leads of the leadframe. Selected ones of the ground sites of the semiconductor chip are also electrically connected to the common ground portion of the leadframe. The method also includes the step of electrically isolating each of the signal leads from each other and from the common ground portion of the leadframe.

According to other preferred aspects, the invention also is a leadframe including a single layer of electrically conducting material, a semiconductor chip support, a common ground portion substantially surrounding the semiconductor ship support and electrically connected to the semiconductor chip support, a plurality of signal leads electrically isolated from each other and from the common ground portion, and a plurality of ground leads electrically connected to the common ground portion.

According to additional preferred aspects, the invention also is directed to an electronic package including a leadframe. The leadframe includes a single layer of an electrically conducting material, a semiconductor chip support, a common ground portion substantially surrounding the semiconductor chip support, and electrically connected to the semiconductor ship support, a plurality of signal leads electrically isolated from each other and from the common ground portion, and a plurality of ground leads electrically connected to the common ground portion. A semiconductor chip including a plurality of signal sites and a plurality of ground sites is mounted on the semiconductor chip support of the leadframe. A plurality of electrical connections are provided between selected ones of said signal sites of said semiconductor chip to respective ones of the signal leads of the leadframe and a plurality of electrical connections between selected ones of the ground sites of the semiconductor chip to respective ones of the ground leads of the leadframe.

Still other objects and advantages of the present invention will become readily apparent to those skilled in this art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications and various obvious respects without departing from the invention. Accordingly, the drawings and description are to be regarded as illustrative in nature and not as restrictive.

Still other objects and advantages of the present invention will become readily apparent those skilled in this art from the following detailed description, wherein it is shown and described only the preferred embodiments of the invention, simply by way of illustration of the best mode contemplated of carrying out the invention. As will be realized, the invention is capable of other and different embodiments, and it's several details are capable of modifications in various obvious respects, without departing from the invention. Accordingly, the drawings and description are to be regarded as illustrative in nature and not as restrictive.

DETAILED DESCRIPTION OF PREFERRED EMBODIMENTS

Figure 1:
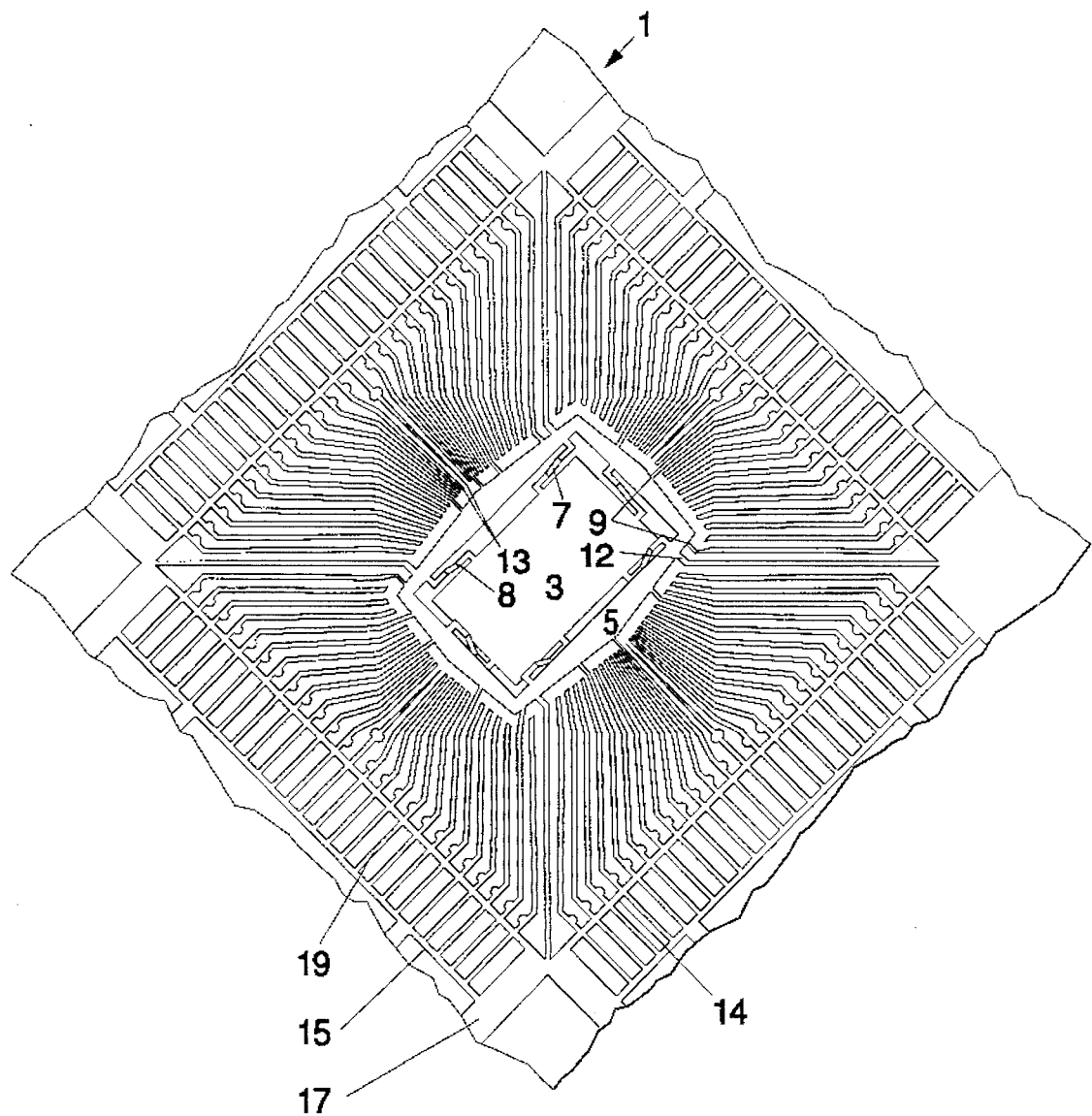
FIG. 1 represents an overhead view of an embodiment of a single-layer leadframe according to the present invention.

Typical high performance leadframes currently used in electronic packaging include a plurality of layers. An example of such a package is the multi-layer molded plastic package (D. Mallik et al., *Multi-layer Molded Plastic Package;* 3 89 Japan International Electronic Manufacturing Technology Symposium (IEMT), Nara City, Japan, Apr., 27, 1989). The individual layers in such a package function as signal, ground and power planes.

However, constructing multi-layer leadframes requires a great deal of time and material. The need for these packages has greatly increased as circuit integration has increased. With increased circuit integration has come an increase in the number of leads emanating from the integrated circuit chip which must be connected to the leadframe and ultimately to the device or overall package which the chip is a part of.

Although such multi-layer leadframes are effective, they are complex in design and construction. A plurality of steps must be used in order to build-up the layers. Leads must be provided for each of the functioning layers. The leads may be etched or provided with another process in each of the layers. Creating such structures requires time and material.

The present invention was developed to solve problems existing in known leadframe designs. By providing a simple single layer leadframe structure 1 which incorporates both ground leads 9 and signal leads 13 in the single layer structure for the attachment of integrated circuit chips 2, the present invention provides an efficient, economical solution to known single and multi-layer leadframe designs. The present invention not only offers ground leads 9 and signal leads 13 in a single layer member 1, but also provides an enhanced single layer leadframe offering a ground bussing feature with ground plane capability.

In the present invention, the semiconductor integrated chip 2 shown in FIGS. 4–7, also commonly known as a die, may be back bonded using a variety of techniques to a conventional die bond pad feature 3. In FIGS. 4–7, the bonding material securing the chip 2 to the die bond pad 3 is represented by the number 4. The die bond pad 3 may be of a known design. The die bond pad 3 may be connected via tie bars 7 to a ground buss ring 5. External ground leads 9 may be provided for connecting the leadframe 1 and chip 2 to external circuit boards or cards, other packages, or devices (not shown). The ground leads 9 may be connected to the ground buss ring 5. This ground ring 5 and associated ground leads 9 allow for more ground connects than with conventional leadframes designs. The die bond pad 3 may be downset via tie bars 7. This provides the possibility of conventional wire bond process tooling, thereby allowing the present invention to be adapted for use with known bonding and connecting technologies using existing equipment.

Figure 2:
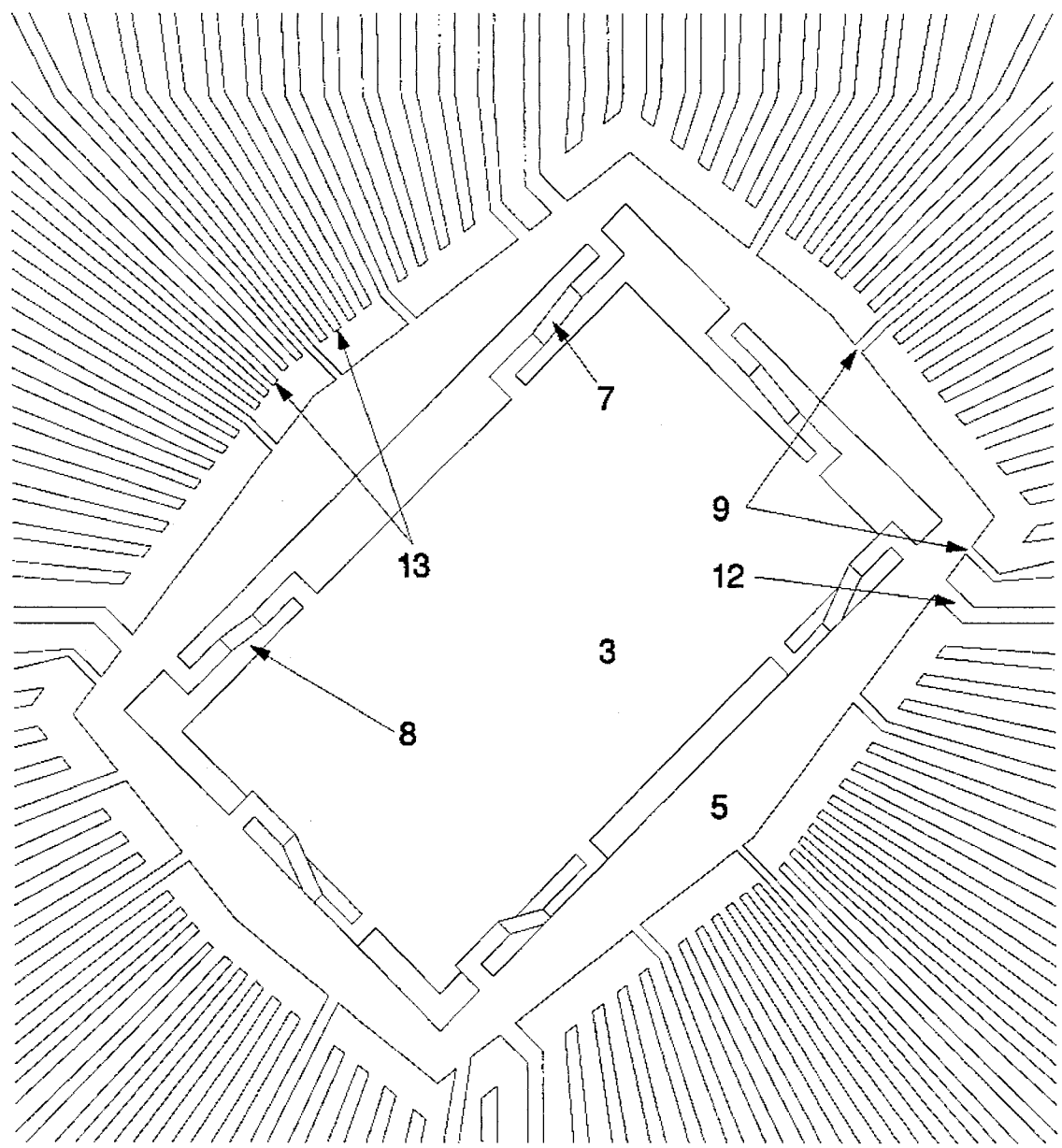
FIG. 2 represents a close-up overhead view of the die bond pad of the embodiment shown in FIG. 1.

FIG. 1, shows an embodiment of a single layer leadframe according to the present invention. FIG. 2 shows a close-up of the die bond pad 3 structure. The embodiment shown in FIGS. 1 and 2 includes a single layer leadframe 1. The leadframe 1 preferably is formed of an electrically conducting material. The material may be metal. Examples of materials from which the leadframe 1 and its constituent components may be formed from include, among others, copper, copper alloys, and nickel-iron alloys. However, any other substances may be used to form the leadframe 1 which allow the leadframe to function as described herein.

The leadframe 1 preferably includes a centrally located die bond pad 3. The die bond pad 3 is also known by other names, such as die pad, or die paddle. The die bond pad 3 serves as a foundation upon which a semiconductor integrated chip 2 is mounted. The size of the die bond pad 3 may be varied, depending upon the application in which the leadframe 1 is being used. In particular, the die bond pad 3 preferably is shaped so as to be of sufficient size to receive the semiconductor chip to be mounted thereon, providing a sufficient amount of space for the chip 2, optimizing use of material made to form the die bond pad 3, satisfying the physical and electrical requirements of the die bond pad 3 so as to ensure that it is structurally sound, and allowing the chip 2 and leadframe 1 to function properly. The thickness of the die bond pad 3 may also be varied depending, at least in part, upon the above-described design requirements. The die bond pad 3 can have any suitable shape, such as square, rectangular, octagonal, round, oval, or any other suitable shape. In the embodiment shown in FIGS. 1 and 2, the die bond pad 3 is rectangular.

The dimensions of the die bond pad 3 depend upon, among other factors, the die 3 size, the type of package, and the capability of the wire bonder used. In a typical embodiment, the leadframe 1 of the present invention has a thickness of from about 0.005 inches to about 0.015 inches. However, the thickness of the leadframe 1 depends upon, among other factors, the package type, number of ground leads 9 and signal leads 13 and the properties of the leadframe 1 material. The development of stronger and higher conductivity materials could allow the use of smaller thicknesses of the material.

The die bond pad 3 of the single layer leadframe 1 of the present invention preferably functions as a groundplane. Thereby, the die bond pad 3 provides the function of a groundplane in a single layer structure which in other known leadframes is performed by one layer of a multi-layer structure. In this manner, the present invention provides the benefits of a multi-layer structure in a single layer construction which is both simpler and more cost efficient, saving a great deal of material and energy, among other things, than multi-layer structures and much easier to produce.

The die bond pad 3 of the leadframe 1 of the present invention is preferably surrounded by a ground ring 5. The ground ring 5 preferably completely surrounds the die bond pad 3 as in the embodiment shown in FIGS. 1 and 2. Alternatively, the ground ring 5 may be comprised of a plurality of sections each connected to the die bond pad 3. Such sections may be electrically connected. The shape and surface area of the ground ring 5 may vary, depending upon the application, including the size of the leadframe 1 and the support the leadframe will require to maintain its structural stability, the number of ground leads 10 from the chip 1 which need to be attached to the ground ring 5, and the number of ground leads 9 which must emanate from the ground ring 5, among other factors.

As shown in FIGS. 1 and 2, the ground ring 5 may be connected to the die bond pad 3 with a plurality of supporting members or tie bars 7 placed a various locations about the die bond pad 3. In an embodiment in which the ground ring 5 includes more than one segment, the segments may individually be connected by one or more supporting members 7 to the die bond pad 3. Preferably, the supporting members 7 are formed from the same material as the die bond pad 3. Preferably, the ground ring 5 and the die bond pad 3 are formed from the same piece of material. In preferred embodiments, at least one supporting member 7 is placed on each side of the die bond pad 3 to provide adequate structural support to the die bond pad 3.

Figure 3:
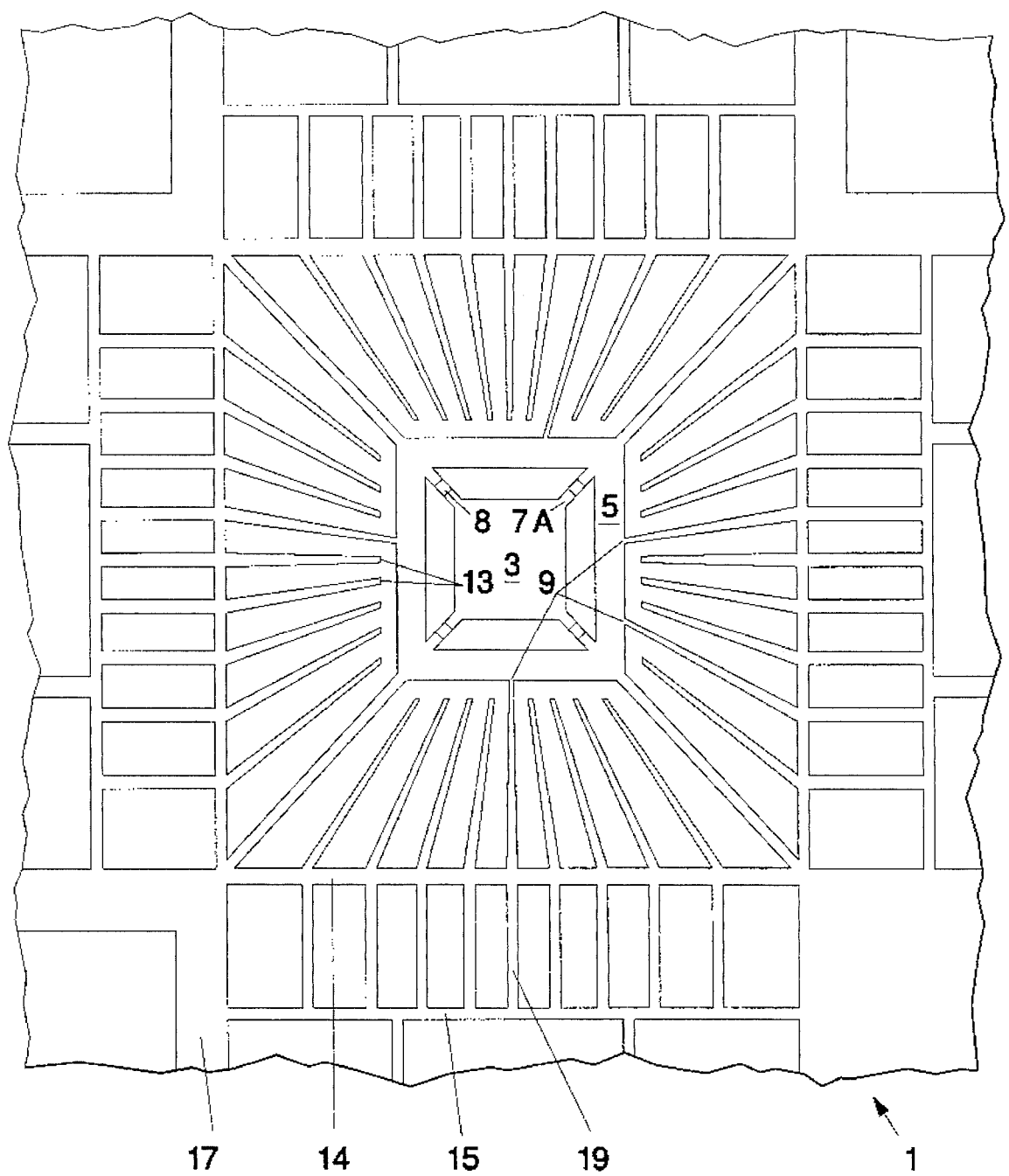
FIG. 3 represents an overhead view of another embodiment of a single-layer leadframe according to the present invention.

In the embodiments shown in FIG. 1, the supporting members or tie bars 7 are generally Z-shaped. The tie bars 7 may include bends or kinks 8 so that the die bond pad 3 is offset, or located slightly below the plane of the ground leads 9 and signal leads 13 and the other parts of the leadframe 1, so that the die 2 may be centrally located in the package. Offsetting the die 2 minimizes stresses on it, particularly in plastic packages, and is well known in the art. The degree to which the die 2 is offset depends upon the degree of bending or kinking in the tie bars 7, depends upon, at least in part, the die 2 thickness. FIG. 3 also represents an overhead view of the die bond pad 3 of the leadframe 1 including tie bars 7A located at the corners of the die bond pad. These tie bars 7A may function substantially the same as the tie bars 7 in the embodiment shown in FIGS. 1 and 2.

With the die bond pad 3 on one side of the plane of the leadframe 1, the chip 2 will remain in the center of the package to result in the formation of a symmetric package. This movement of the chip 2 is commonly known as down setting the chip. Down setting the chip 2 produces a symmetric package, optimizes performance of the package and helps to reduce forces on the chip. The chip 2 may also be down set to accomplish certain other purposes, such as to employ conventional wirebond process tooling.

The supporting members 7 may also be formed in other shapes, such as straight between the ground ring 5 and the die bond pad 3. The number, shape, and other characteristics of the supporting members 7 connecting the die bond pad 3 with the ground ring 5 may be optimized to optimize the electrical characteristics of the device. Similarly, the spacing of the supporting members 7 about the die bond pad 3 and the ground ring 5 may also be optimized to optimize both the electrical and physical characteristics of the leadframe structure.

The ground sites (not shown) on the chip 2 attached to the die bond pad 3 may be directly coupled to various sites about the ground ring 5 without the need for individual wiring to corresponding individual ground leads. Leads 10 connecting the ground sites on the chip to the ground ring may be seen in cross section in FIGS. 4–7. The electrical connections between the chip 2 ground sites (not shown) and the ground ring 5 may be formed using techniques known in the art. For example, FIGS. 4–7 show bond wires 10 and 11 respectively electrically connecting the ground and signal sites (not shown) on the chip 2 to the ground leads 9 and signal leads 13.

Electrically connecting the chip 2 to the ground ring 5 of the present invention greatly simplifies the construction of a package including a leadframe 1 of the present invention. Also, a universal ground ring may be provided for chips having different ground sites thereby eliminating the need to provide specific ground leads and also eliminating the need for identifying and connecting new specific ground leads to specific ground sites on a chip. Furthermore, without the need to provide an individual ground lead for connecting to each ground site of the chip, a chip with great deal more ground sites may be attached than in conventional leadframe designs.

As shown in FIG. 1, emanating from the ground ring 5 and electrically attached thereto may be a plurality of ground leads 9. These ground leads 9 are ultimately attached to the chip 2 through the leads 10 shown in FIGS. 4–7. The ground leads 9 extend away from the ground ring 5 and are ultimately connected to a corresponding element of a circuit board or card (not shown) or to a package in which the leadframe 1 of the invention and attached chip 2 are incorporated.

When the leadframe 1 is formed, the ground leads 9 and signal leads 13 are connected to a dam bar 14 which preferably entirely surrounds the leadframe 1 as shown in FIG. 2. The ground leads 9 and signal leads 13 preferably include a portion 19 that extends beyond the dam bar 14 to an outside tie bar 15. The outside tie bar 15 also preferably extends along each side of the leadframe 1 as shown in FIGS. 1 and 3. Alternatively, the outside tie bar 15 extends completely around the die bond pad 3, ground ring 5, ground leads 9, signal leads 13, and other components of the leadframe 1. As shown in FIGS. 1 and 3, if the outside tie bar 15 is made up of a plurality of segments extending along each side of the leadframe, then they may be connected to other portions 17 of the overall structure from which the leadframe 1 may be formed. The dam bar 14 and the outside tie bar 15 help to structurally stabilize the leadframe 1 during connection of the chip 2 and other processing. As discussed below in detail, the dam bar 14 and the outside tie bar 15 may be trimmed off of the leadframe 1 structure after the chip 2 has been attached and other processing performed and must be trimmed prior to supplying power through the leadframe 1 to avoid shorting together the leads.

The ground leads 9 may be made from the same material as the rest of the leadframe 1. The ground leads 9 may be formed integrally with the die bond pad 3 and ground ring 5 or may be attached thereto. In one embodiment, the ground leads 9 are formed by stamping them from a sheet of material along with the rest of the leadframe 1 according to known methods for stamping a patterned part from a sheet of material. In such an embodiment, the ground leads 9 may be stamped simultaneously with the other elements of the leadframe 1 or may be stamped individually or all together at a different time than the rest of the leadframe is stamped.

Alternatively, the ground leads 9 may be formed by etching them in the sheet of material from which the leadframe is formed. In such an embodiment, the ground leads 9 may be formed using any known technique for etching leads in a sheet of material.

Additional ground leads 9 may be provided on the leadframe by wire bonding the leads to the ground ring 5. Alternatively, additional ground leads 9 may be provided by bonding all ground sites (not shown) of the chip 2 directly to the ground ring 5 and then coupling the ground ring 5 to the ground leads 9 as shown in FIG. 1.

The leadframe 1 may also include a plurality of signal leads 13. The signal leads 13 may be bonded to signal sites (not shown) on the chip 2 using wire bonding or any other known techniques for forming electrical connections. The signal leads 13 preferably are electrically isolated from each other and from the common ground ring 5 and from the ground leads 9. As shown in FIG. 1, the signal leads 13, as well as the ground leads 9 may initially be attached to the dam bar 14 which preferably substantially completely surrounds the entire leadframe 1. As shown in FIGS. 1–3, the ends of the signal leads 13 closest to the ground ring 5 are not supported by any structure; connecting them to the ground ring 5 would result in electrically shorting the device. Rather, the dam bar 14 and the outside tie bar 15 hold the signal leads 13 in place so that the signal leads can be connected to the signal sites (not shown) of the chip 2. The connections to the dam bar 14 and the outside tie bar 15 are then severed after the chip 2 has been attached and the structure enclosed as described below.

The dam bar 14 and outside tie bar 15 physically support the signal leads 13 and ground leads 9 while the leadframe 1 is being processed and the chip 2 is being attached and electrically connected to the ground ring 5, ground leads 9 and signal leads 13, or any other device, component or support. The outside tie bar 15 may also support and stabilize the leadframe 1 and attached chip 2 while they are being encapsulated or enclosed in a protective enclosure member(s). The signal leads 13 and ground leads 9 may then be supported by their connections to the chip 2 and by any encapsulating material or protective cover.

As with the ground leads 9, the signal leads 13 of the present invention may also be formed in a plurality of ways. For instance, the signal leads 13 may be formed by stamping them in the sheet of material from which the leadframe 1 is formed. In forming the ground leads 9 or signal leads 13 in this manner a die may be formed which includes sharp edges formed in a pattern to cut the leadframe from a sheet of material by forcing the die into the sheet thereby cutting it. Alternatively, the ground leads 9 and/or signal leads 13 may be formed individually by stamping them out with a single sharp edge. In other embodiments, the ground leads 9 and/or signal leads 13 may be formed by cutting the sheet of material with a laser, for instance. Additionally, the ground leads 9 and/or signal leads 13 may be formed by etching them in the leadframe using commonly known etching techniques. Any other technique may be used to form the signal leads 13, ground leads 9, die bond pad 3, supporting members 7, 7A, 12, 14, and 15, and/or any other part of the leadframe 1.

The leadframe 1 may also include a plurality of non-electrically connected supporting members 12, also known as tiebars, attached to the ground ring 5 or other part of the leadframe 1. These supporting members 12 may physical attach the leadframe 1 to a circuit board (not shown), circuit card (not shown), or other device (not shown) in which the chip 2 and leadframe 1 are incorporated. Alternatively, the supporting members 12 may be used only during the processing of the leadframe 1 and may be cut out after processing is completed.

The ground leads 9, signal leads 13, supporting members 7, 7A, 12, 14, and 15, as well as the ground ring 5 may be formed from the same material that the die bond pad 3 of single layer leadframe 1 of the present invention is formed, including those materials discussed above, or may be formed from any other suitable material.

The present invention also includes an electronic package, examples of which are shown in FIGS. 4–7, including a leadframe 1 described above and shown in FIGS. 1–3. Such an electronic package includes a leadframe 1 which as described above. Also, an electronic package according to the present invention preferably includes a semiconductor chip 2 including a plurality of signal sites (not shown) and a plurality of ground sites (not shown) attached to the die bond pad 2.

The chip 2 may be attached using known chip attachment techniques. For example, an adhesive may be used to attach the chip. In other embodiments, metallurgical bonding techniques may be used to secure the chip to the die bond pad. Such metallurgical bonding techniques include soldering and a gold/silicon eutectic. Preferably, the material used to attach the chip to the die bond pad is electrically conductive so that the die bond pad acts as a ground plane. The material securing the chip 2 to the die bond pad 3 is represented by the number 4 in FIGS. 4–6.

An electronic package according to the present invention may also include a plurality of electrical connections 10 formed between ground sites (not shown) on the semiconductor chip 2 and ground ring 5 of the leadframe 1 and a plurality of electrical connections 11 between the signal sites (not shown) on the semiconductor chip 2 and the signal leads 13 of the leadframe. The electrical connections between the ground and signal sites of the semiconductor chip 2 and various ground leads, signal leads 13 and the ground ring 5 of the leadframe 1 may be formed in any known manner. For instance, wire bonding could be used to form these electrical connections.

Figure 4:
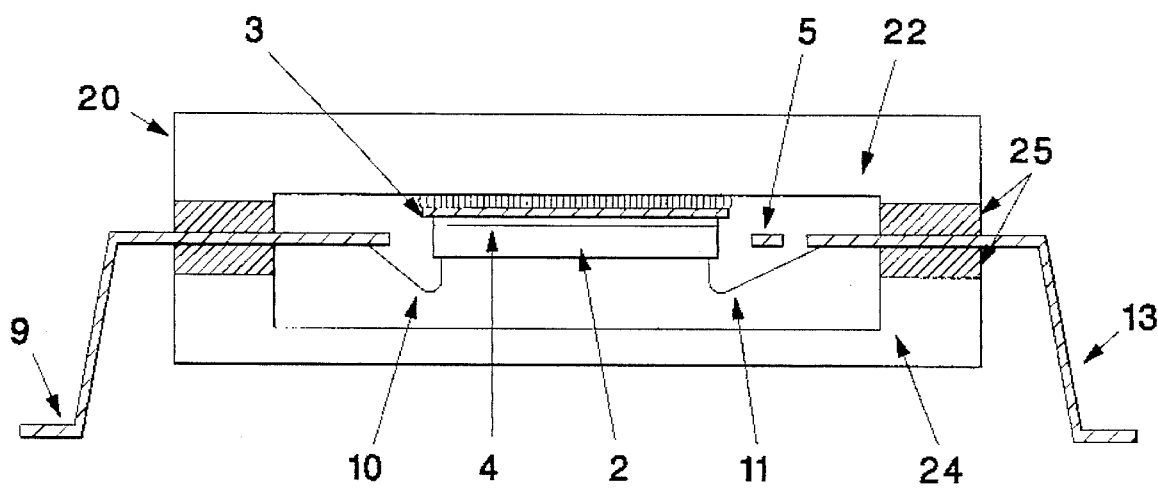
FIG. 4 represents a cross-sectional view of an embodiment of an electronic package according to the present invention including an embodiment of a single-layer leadframe according to the present invention, a semiconductor chip mounted to the leadframe, and a protective cover surrounding the leadframe and the chip.

Additionally, an electronic package including leadframe 1 of the present invention and a semiconductor chip 2 as described above may also include an enclosure. FIG. 4 shows an embodiment of a leadframe 1 according to the present invention with a chip 2 attached and electrically connected to the ground and signal sites, with the entire structure surrounded by an enclosure 20. The enclosure 20 preferably encloses the entire leadframe 1 and the chip 2 in single package. The enclosure 20 may be made of metal, ceramic, plastic, or any other suitable material.

The enclosure 20 may comprise a first base part 22 and a cover part 24. The leadframe 1 may be positioned on the base part 22 and then the cover part 24 may be applied over the base part and the leadframe on the opposite side of the leadframe from the side on which the base part is attached. The sides of the leadframe 1 preferably are connected to the base part 22 and cover part 24 with an electrically insulating material 25, such as an electrically insulating epoxy. Using an electrically insulating material 25 is especially important if the enclosure parts 22 and 24 are made of an electrically conductive material and the part adjacent the die bond pad 3, part 22 in the embodiment shown in FIG. 4, is electrically connected to the die bond pad 3 and chip 2. In the embodiment shown in FIG. 4, the arrangement of the chip 2 and the enclosure 20 is known as a chip facing down or cavity down arrangement.

The electrically insulating material 25 may be applied to the parts of the enclosure 20 and then the parts of the enclosure placed over the leadframe 1. Preferably, the electrically insulating material 25 engages the ground leads 9 and signal leads 13 so as to immobilize them.

One part 22 of the enclosure 20 may be attached to the die bond pad 3 of the lead frame 1, as shown in FIG. 4. A variety of known materials may be used to attach the chip 2 to the leadframe 1. If metal or another electrically conductive material is used to form the enclosure 20, an electrically conductive material, such as electrically conductive epoxy and silver filled epoxy allows the die bond pad 3 to act as a ground plane. Other materials and methods may be used to attach the enclosure 20 to the leadframe 1.

After enclosing the leadframe 1, chip 2, signal leads 13, and ground leads 9 leads in the enclosure 20, the dam bar 14, outside tie bar 15 and other sections 17 of the structure in which the leadframe 1 is formed may be cut off. The portions of the dam bar 14 between individual ground leads 9 and/or signal leads 13 of the leadframe 1 preferably are also cut off after the attachment of the enclosure 20. Preferably, the enclosure 20 extends out on the leadframe 1 only slightly less than the dam bar 14.

Figure 5:
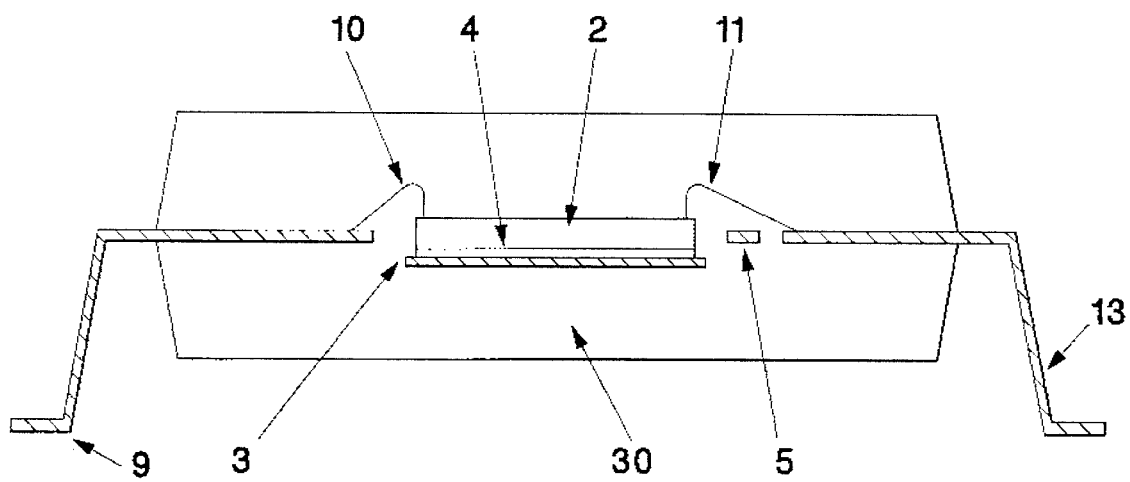
FIG. 5 represents a cross-sectional view of another embodiment of an electronic package according to the present invention including another embodiment of a single-layer leadframe according to the present invention and a semiconductor chip mounted to the leadframe, the leadframe and chip are enclosed in a plastic molding compound.
Figure 6:
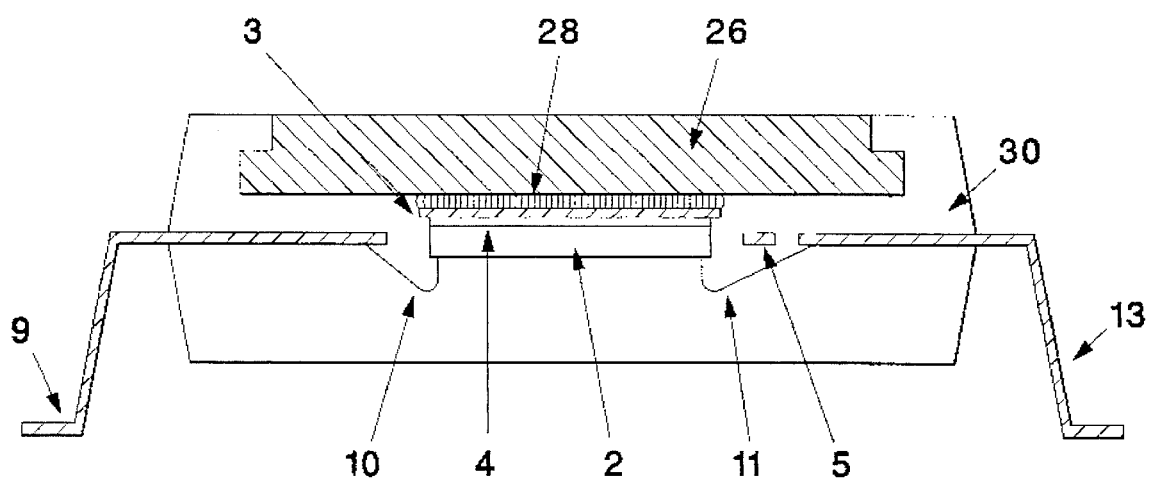
FIG. 6 represents a cross-sectional view of a further embodiment of an electronic package according to the present invention including a further embodiment of a singe-layer leadframe according to the present invention and a metal slug, the leadframe, chip, and metal slug are enclosed in a plastic molding compound.
Figure 7:
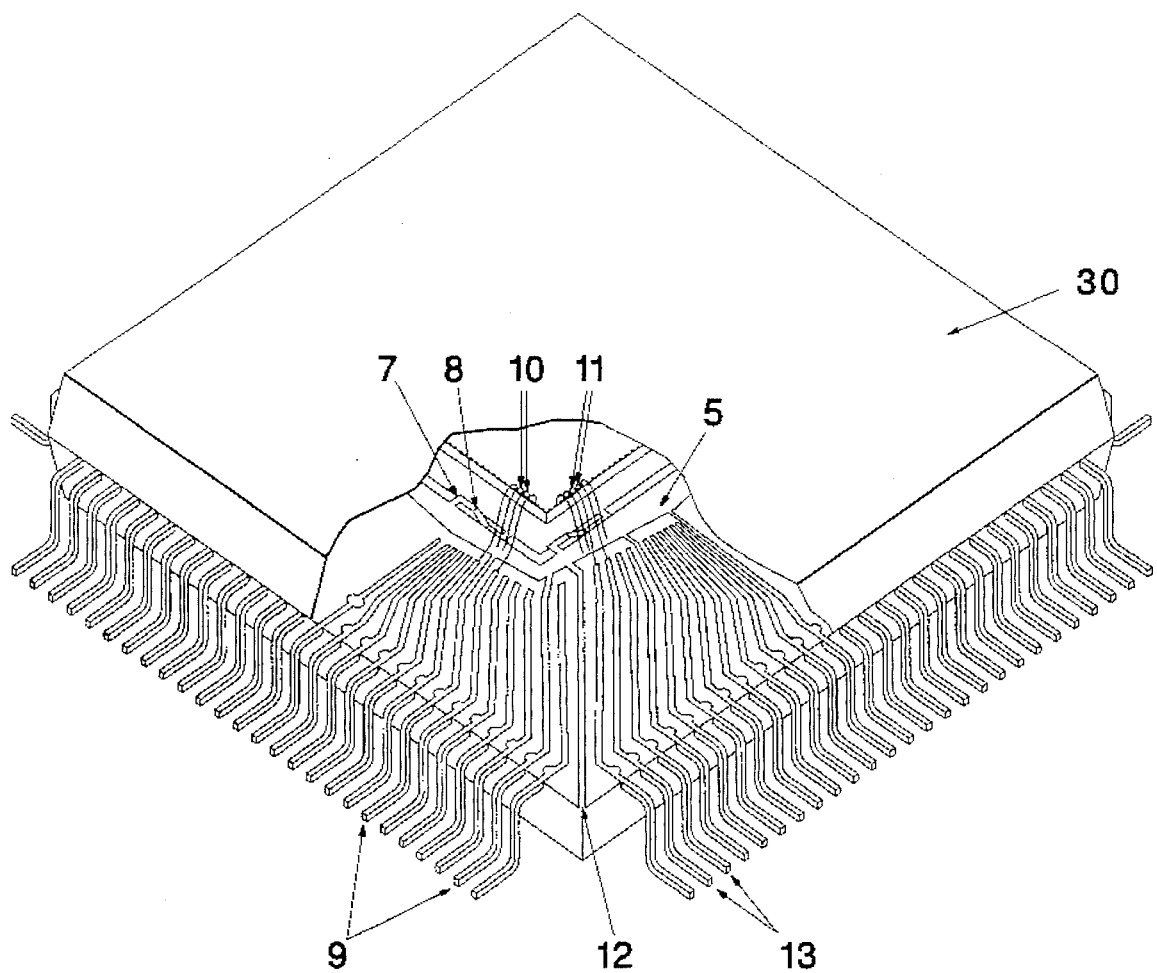
FIG. 7 represents an isometric cut-away view of an electronic package according to the present invention incorporating an embodiment of a single-layer leadframe according to the present invention.

The electronic package may also include an enclosure which is formed by encapsulating the leadframe 1 and the semiconductor chip 2 within an electrically insulating material 30. Example of such electronic packages are shown in FIGS. 5–7. Such insulating materials include Hysol MG46F (made by Dexter Corporation), Sumitomo EME-6300H, Toshiba KE-300J, among others. The encapsulation 30 or enclosure 20 may protect the electronic package both from physical damage as well as electronic damage.

The leadframe 1 and the attached chip 2 may be encapsulated in plastic or other material at the same point in the processing that the enclosure 20 may be attached to the leadframe. In preferred embodiments, the encapsulation 30 preferably extends out along the leadframe 1 a similar distance to the enclosure 20, in other words, in the vicinity of the dam bar 14. The encapsulating material 30 may be applied to the leadframe 1 with conventional molding techniques.

In the embodiment shown in FIG. 6, a metal slug 26 has also been attached to the die bond pad 3 on the side opposite where the chip 2 is attached. The metal slug 26 may act as a heat spreader in certain situations, when the leadframe 1 is subjected to certain processes. Slugs made of other materials which function the same as the metal slug 26 may also be attached to the leadframe 1. The leadframe 1, the attached chip 2, the slug, and any other components may then be encapsulated in a plastic molding compound 30. In some embodiments, at least a portion of the slug 26 may be left exposed, and not covered by the encapsulating material 30. In other embodiments, the entire slug 26 will be covered by the encapsulating material 30. As discussed below, whether and to what degree the slug 26 is covered will affect the performance of the package.

The metal slug 26, just as with the chip 2, may be attached to the die bond pad 3 of the leadframe 1 with an electrically conductive epoxy, such as silver-filled epoxy. In such embodiments, the metal slug 26 may also act as a ground plane. The slug 26 may also be attached using other means such as a non-electrically-conductive epoxy. The attachment material is represented by number 28.

Regardless of what type of enclosure 20 or encapsulation 30 is used to enclose the leadframe 1 and the attached chip 2, after the enclosure or encapsulation, the dam bar portions between adjacent leads are cut, leaving the leads unconnected. The outside tie bar 15 may then be cut, thereby freeing up all of the ends of the ground leads 9 and signal leads 13. Finally, the ground leads 9 and signal leads 13 are bent into a suitable shape for attaching the leadframe 1 to a circuit board (not shown) or plugging it into a socket (not shown). Such forms include 90° bent leads for soldering into holes of a circuit board or card, for instance, J-leads, and gull-wing shapes for surface mounting. The shape known as a gull-wing shape is shown in FIGS. 4–6. In these embodiments, the leads 9 and 13 are bent in a direction either above or below the plane of the leadframe 1. Then, the tips of the leads 9 and 13 are bent so as to be parallel to the plane of the leadframe 1. The package may then be attached to, for example, a circuit board or card or to a device, among other things.

As stated above, the method of enclosing and encapsulating the leadframe 1 can affect the performance of the lead frame. A leadframe totally encapsulated, without an attached slug, has the worst performance relative to the other embodiments. However, such an embodiment is also the least costly. Therefore, such an embodiment is still quite useful.

The encapsulated lead frame with an attached slug which is enclosed within the encapsulating material offers better performance than the totally encapsulated leadframe without the attached slug. However, this embodiment is more costly. More costly still, but also offering even better performance is a leadframe with an attached slug which is partially exposed.

Even better performance may be obtained from a leadframe enclosed within a metal package. Again, this embodiment is still more costly. Another relatively more costly embodiment specifically discussed above is a leadframe which is enclosed in a ceramic enclosure. Of course, these embodiments are only illustrative of the present invention. In determining which embodiment of the present invention to make, the performance requirements of the application should be weighed with the cost, or economy, required.

Although the statements concerning cost are generally true, costs can vary depending, at least in part, upon production volume, availability, demand, and other such factors. Therefore, the statements concerning cost may not always hold up.

The present invention also includes a method of forming a leadframe, as described above, and a method of forming an electronic package.

The method of forming a leadframe 1 preferably includes the step of providing a sheet of an electrically conducting material. The sheet of material may be cut with a laser, or stamped with a die or processed in any known suitable manner for forming a pattern in a sheet of material. The pattern formed in the sheet is that of the leadframe 1. Therefore, the die bond pad 3, the supporting members 7, the ground ring 5, the ground leads 9, the supporting members 12, the signal leads 13, the dam bar 14, the outside tie bar 15 and the other portions of the leadframe may be formed simultaneously, or individually using whatever technique is selected. The leadframe 1 may be stamped from a sheet of material somewhat like a roll of film and include elements for engaging an apparatus for stamping and processing the leadframe. The components of the single layer leadframe 1 of the present invention may also be formed individually and then joined together using known techniques. In one embodiment, the die bond pad 3 and ground ring 5 are formed in a sheet of material. The ground leads 9 and signal leads 13 may be formed separately in the sheet using techniques such as etching or die stamping. The leads 9 and 13 may also be formed separately from the die bond pad 3 and ground ring 5 and then attached to form the leadframe 1.

A method of forming an electronic package according to the present invention preferably includes forming a single-layer leadframe 1 as described above, or providing a single-layer leadframe 1. A semiconductor integrated chip 2 may then be attached to the die bond pad 3 of the leadframe 1. The chip 2 may be attached using adhesive, solder, gold-silicon eutectic, other metallurgical bonding techniques, or any other suitable method.

In forming an electronic package according to the present invention, a plurality of electrical connections 10 may be formed respectively between selected ones of the ground sites (not shown) on the semiconductor chip 2 and selected sites on the common ground portion, or ground ring 5, of the leadframe 1 or respective added individual ground leads. Electrical connections 11 may also be formed between selected ones of the signal sites (not shown) on the semiconductor chip 2 and respective ones of the signal leads 13 of the leadframe 1. The electrical connections 10 and 11 between the ground and signal sites of the semiconductor chip 2 and various ground leads (not shown) and signal leads 13 and the ground ring 5 of the leadframe 1 may be formed in any known manner. For instance, wire bonding could be used to form these electrical connections. Furthermore, any other process which is known for forming electrical connections in the art may be used.

The die bond pad 3 and the attached chip 2 may be offset relative to the plane of the leadframe 1, as shown in the embodiments shown in FIGS. 4-6. Offsetting offers the advantages described above. A slug 26 may be attached to the side of the die bond pad 3 opposite the side where the chip 2 is attached. The die slug 26 is usually only attached to embodiments in which the leadframe 1 is to be completely encapsulated 30 rather than enclosed in a two or more part enclosure 20.

In forming an electronic package according to the present invention, a single layer leadframe 1 according the invention and an attached semiconductor chip 2 may be encased within a protective enclosure 20. The enclosure 20 preferably encloses the entire leadframe 1 and the attached chip 2 in single package. However, preferably, the ground leads 9 and signal leads 13 still extend, at least partially, from the enclosure 20.

The enclosure 20 may comprise a first base part 22 and a cover part 24. The leadframe 1 may be positioned on the base part 22 and then the cover part 24 may be applied over the base part and the leadframe 1 on the opposite side of the leadframe from the side on which the base part is attached. One of the parts of the enclosure 20 may be attached to the die bond pad 3 on the side opposite where the chip 2 is attached. The enclosure part may be attached with any known material and/or method, particularly the materials and methods discussed above.

A preferably electrically insulating material 25 may be applied about the perimeter of the parts 22 and 24 of the enclosure 20 on the face which will be adjacent to the leadframe 1 prior to attaching the enclosure parts to the leadframe and the leads 9 and 13. The electrically insulating material 25 may have adhesive properties, alternatively, the material may be heated to cause the layers on one part of the enclosure to adhere to the leadframe 1 and to the material on the opposite enclosure part. The parts of the enclosure may then be placed over the leadframe 1 so that the insulating material 25 engages the leads 9 and 13. The electrically insulating material 25 either then adheres together or is processed by, for example, heating it to cause the portions on each part of the enclosure to adhere together. Preferably, the electrically insulating material 25 preferably completely surrounds the leads, sealing the inside of the leadframe 1.

The electronic package may also include an enclosure which is formed by encapsulating the leadframe and the semiconductor chip within an electrically insulating material 30. Such insulating materials include those specified above, among others. When encapsulating the leadframe 1 and chip 2, the leadframe may be placed within a mold and the encapsulating material 30 pumped into the mold, according to known techniques. Preferably, the ground leads 9 and signal leads 13 extend from the encapsulating material 30. The encapsulating material 30 may or may not completely enclose a slug 26 attached to the die bond pad 3.

After encapsulating the leadframe 1 and attached chip 2 or enclosing them in a protective enclosure 20, the portions of the dam bar 14 between adjacent leads 9 and 13 may be cut away and then the outside tie bar 15 cut from the ends of the leads 9 and 13. The enclosure 20 or encapsulating material 30 will maintain the leads 9 and 13 in position. The connections to the ground ring 5 and/or ground and/or signal sites on the chip 2 may help to maintain the leads 9 and 13 in position. The leads 9 and 13 may then be bent, as described above and shown in the embodiments shown in FIGS. 4-7. The leads 9 and 13 may also be left straight. An electronic package thus formed may then be attached and electrically connected to a circuit board, circuit card, or any other apparatus or device.

In this disclosure, there is shown and described only the preferred embodiments of the invention, but, as aforementioned it is to be understood that the invention is capable of use in various other combinations and environments and is capable of changes or modifications within the scope of the inventive concept as expressed herein.

What is claimed is:

1. An electronic package, comprising:

a leadframe, comprising a single layer of an electrically conducting material, a semiconductor chip support, a common ground portion surrounding said semiconductor chip support and electrically connected thereto, a plurality of signal leads electrically isolated from each other and from said common ground portion, and a plurality of ground leads electrically connected to said common ground portion;

a semiconductor chip including a plurality of signal sites and a plurality of ground sites, said semiconductor chip being mounted on said semiconductor chip support of said leadframe;

a plurality of electrical connections between selected ones of said signal sites to respective ones of said signal leads and between selected ones of said ground sites to respective ones of said ground leads; and a protective enclosure substantially about said semiconductor device, said semiconductor chip support, said common ground portion of said leadframe, and at least a portion of said signal leads.

2. An electronic package according to claim 1, wherein said protective enclosure comprises an encapsulation of an electrically insulating material.

3. An electronic package according to claim 1, wherein said leadframe further comprises tie bars for connecting said common ground portion to said semiconductor chip support, said tie bars both supporting said semiconductor chip support and providing electrical connection between said common ground portion and said semiconductor chip portion.

4. An electronic package according to claim 1, wherein said leadframe is formed of a metal selected from the group consisting of copper, copper alloys, and nickel-iron alloys.

5. An electronic package according to claim 1, wherein said ground, leads, and support are formed by stamping them in said leadframe.

6. An electronic package according to claim 1, wherein said ground, leads, and support are formed by etching them in said leadframe.

7. An electronic package according to claim 1, wherein said chip is positioned with a method selected from the group consisting of adhesive, and solder, gold/silicon eutectic, and other metallurgical bonding techniques.

8. An electronic package according to claim 1, wherein said selected ones of said signal sites are electrically connected to respective ones of said signal leads and selective ones of said ground sites are electrically connected to said common ground portion of said leadframe by wire-bonding.

9. An electronic package according to claim 1, further comprising slug attached to the semiconductor ship support on a surface opposite where said chip is attached.

10. An electronic package according to claim 1, wherein said protective enclosure comprises a first base part and a cover part and said leadframe is positioned on said base part and said cover part is applied over said base part and said leadframe.

11. An electronic package according to claim 1, wherein said protective enclosure is made of at least one material selected from the group consisting of metal, ceramic, and plastic.

* * * * *